United States Patent [19]

Althouse et al.

[11] Patent Number: 4,778,326
[45] Date of Patent: Oct. 18, 1988

[54] METHOD AND MEANS FOR HANDLING SEMICONDUCTOR AND SIMILAR ELECTRONIC DEVICES

[75] Inventors: Victor E. Althouse, Los Altos; Bruce J. Benjamin, Palo Alto, both of Calif.

[73] Assignee: Vichem Corporation, Stanford, Calif.

[21] Appl. No.: 497,430

[22] Filed: May 24, 1983

[51] Int. Cl.[4] .............................................. B65G 1/00
[52] U.S. Cl. ..................... 414/786; 206/330; 206/471; 269/21; 414/417; 414/787; 29/743
[58] Field of Search ............... 414/403, 786, 787, 416, 414/417, 422; 29/413, 743, DIG. 44; 209/3.3, 702, 703, 905; 269/21; 221/26, 210, 211; 248/362, 363; 206/330, 332, 471

[56] References Cited

U.S. PATENT DOCUMENTS

| | | | |
|---|---|---|---|
| 1,198,402 | 9/1916 | Bagnall | 269/21 X |
| 3,158,381 | 11/1964 | Yamamura | 248/362 X |
| 3,190,460 | 6/1965 | Rubin | 248/362 X |
| 3,465,874 | 9/1969 | Hugle et al. | 206/330 |
| 3,520,055 | 7/1970 | Jannett | 29/423 X |
| 3,562,057 | 2/1971 | McAlister et al. | 29/413 X |
| 3,652,075 | 3/1972 | Thompson | 269/21 |
| 3,707,760 | 1/1973 | Citrin | 29/413 |
| 3,809,050 | 5/1974 | Chough et al. | 269/21 X |
| 3,920,121 | 11/1975 | Miller | 206/330 |
| 4,221,356 | 9/1980 | Fortune | 248/363 |
| 4,285,430 | 8/1981 | Caunt | 206/471 |
| 4,395,451 | 7/1983 | Althouse | 428/141 |
| 4,410,168 | 10/1983 | Gotman | 269/21 |
| 4,428,815 | 1/1984 | Powell et al. | 248/362 X |

FOREIGN PATENT DOCUMENTS

| | | | |
|---|---|---|---|
| 2058658 | 4/1981 | United Kingdom . | |
| 2058708 | 4/1981 | United Kingdom | 206/471 |
| 2120141 | 11/1983 | United Kingdom | 269/21 |

Primary Examiner—Robert J. Spar
Assistant Examiner—Stuart J. Millman
Attorney, Agent, or Firm—Victor R. Beckman

[57] ABSTRACT

Method and apparatus for handling semiconductor chips and the like are disclosed which include the use of a flat flexible film which is attached to the face of a base member. The face of the base member is formed with recesses covered by the flat flexible film. Chips are loaded onto the flat flexible film in good surface contact therewith whereby they are securely held in position by interfacial, adhesive, or other forces between the chips and film. To facilitate removal of chips from the film, the recesses are connected to a vacuuum source, drawing portions of the flexible film into said recesses and providing the film with a texturized, or undulating, surface. The area of contact between the chips and film is thereby reduced which, in turn, results in a reduction in the force by which the chips are attached to the film, thereby enabling removal of the chips by conventional techniques.

4 Claims, 1 Drawing Sheet

METHOD AND MEANS FOR HANDLING SEMICONDUCTOR AND SIMILAR ELECTRONIC DEVICES

BACKGROUND OF THE INVENTION

The manufacture of semiconductor and other electronic devices including wafers, die, substrates, chips, and the like, includes steps such as breaking, sorting, inspection, bonding, shipping, storage and additional processing. A number of apparatus and methods are commonly employed by processors of such devices in the handling thereof. One such method involves the use of carriers, or trays, which are formed with a plurality of cavities in the face thereof in which the chips are loaded.

Typical disadvantages in the use of cavity trays include:
 (a) Many different cavity sizes are needed to accommodate the multitude of chip sizes that are available.
 (b) Unless the chip size and cavity size are very closely matched, the chip can rotate within the cavity and make subsequent automatic pickup systems, which require precise chip locations, more difficult.
 (c) Chips may turn over within the cavities during shipment, and thus require re-orientation prior to subsequent processing.
 (d) Chips may break as they move within the cavities during shipment.
 (e) Chips tend to be difficult to place within a cavity, particularly small chips, by automatic equipment, since the chips tend to bounce out.
 (f) Chips, particularly small chips, tend to easily dislodge and fly out of the tray, unless particular care is exercised, when the cavity tray is opened.

Other methods for holding and handling chips include:
 (a) A film that contains a pressure sensitive adhesive mounted in a frame. Such frames are often difficult to handle and require special equipment to remove chips from the adhesive film. Commonly, this includes a probe from the bottom of the film to push the chip from the adhesive, and a vacuum tool from the top to capture and remove the chip.
 (b) A non-adhesive elastomeric film that holds chips in place because of intimate surface contact between film and chip. Such films are ordinarily mounted on rigid substrates. Predominantly, small chips are handled on this type of system since larger ones, with increased surface contact area, are difficult to remove by ordinary vacuum techniques.
 (c) A system similar to (b) where the surface of the elastomer has been texturized to reduce the surface contact between chip and elastomer, and thus allow for the removal of larger chips. This system is disclosed in copending U.S. patent application Ser. No. 168,031 filed July 14, 1980, U.S. Pat. No. 4,395,451 issued July 26, 1984 entitled Semiconductor Wafer and Die Handling Method and Means by Victor E. Althouse, one of the present co-inventors. While this system has a number of advantages, it is sometimes difficult to control the degree of texturization so that sufficient surface contact is maintained to retain chips in place.

SUMMARY AND OBJECTS OF THE INVENTION

An object of this invention is the provision of method and means for handling semiconductor and other electronic devices which avoid the above-mentioned and other shortcomings of prior art arrangements.

An object of this invention is the provision of a carrier for handling semiconductor die, wafers, chips, or like devices, upon which the devices are retained in desired position during handling, yet are readily removed from the carrier using conventional vacuum collets, tweezers, or the like.

An object of this invention is the provision of an improved carrier which includes a flexible plastic film which allows for high surface contact between the film and chip for maximum retention prior to chip removal, and the reduction in surface contact by withdrawal of a portion of the flexible film from the chip during chip removal.

The above and other objects and advantages of this invention are achieved by use of a base member having a substantially flat upper face formed with recess means inside the perimeter thereof. A thin flexible film is supported on the face of the base member in sealing engagement with the base member about the perimeter thereof. Chips, or the like, to be handled are supported on the upper face of the thin flexible film in full surface contact with the film. Frictional, interfacial adhesive and/or other forces tightly hold the chips in position on the film. To allow for removal of chips from the film, the film is drawn downwardly into the recess means by reducing the gas pressure in the recess means thereby reducing the surface contact between the chip and film which, in turn, reduces the force by which the chip is attached to the film. If desired, the flexible film may be resilient so as to return to a flat condition in preparation for reuse of the carrier when gas pressure is returned to normal; i.e. restored to ambient pressure. The base member may be adapted for support on a vacuum chuck, or table, to facilitate connection of the recess means to a source of reduced gas pressure.

BRIEF DESCRIPTION OF THE DRAWINGS

The invention, together with other objects and advantages thereof, will be better understood from the following description when considered with the accompanying drawings. In the drawings, wherein like reference characters refer to the same parts in the several views.

Figure 1:
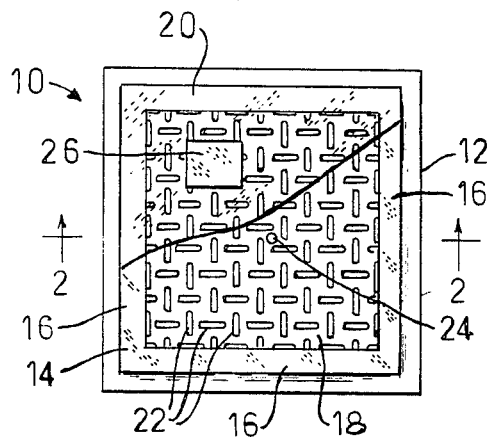
FIG. 1 is a plan view of a carrier embodying the present invention showing a chip carried thereby and a portion of the cover film broken away for clarity.
Figure 2:
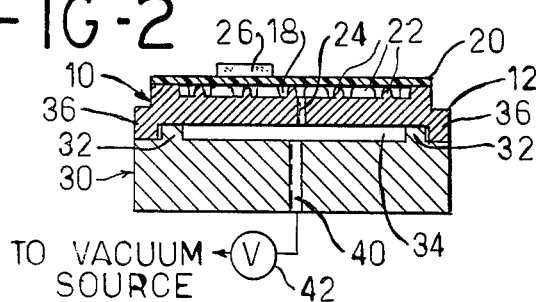
FIG. 2 is a sectional view taken along line 2—2 of FIG. 1.

Reference first is made to FIGS. 1 and 2 of the drawings wherein one form of a novel carrier 10 embodying this invention is shown, which carrier is adapted for use in handling semiconductor chips, wafers, or other such smooth-surfaced articles. The illustrated carrier comprises a base member 12 formed of a suitable rigid material such as glass, plastic, metal, or the like. The base member 12 has an upper face 14 formed with flat marginal edges 16 and a recess 18 therewithin.

A cover 20 in the form of a thin flexible film, or sheet, is attached to the face 14 of the base member 12, a portion of which cover is shown broken away in FIG. 1 for clarity. A plurality of cover-supporting protuberances 22 are located within the margin edges of the base, the upper faces of which protuberances are provided in the plane of the margins 16. The protuberances 22 in the carrier illustrated in FIGS. 1–4 have an elongated horizontal cross-sectional shape, and are arranged in the form of a two-dimensional array in which adjacent protuberances extend at right angles to each other. Preferably, the protuberances are dimensioned such that the recess 18 is made up of only short straight line segments, with no long segments extending, say, between opposite margins of the carrier at any angle. The purpose of this arrangement of protuberances is described below in a further description of FIG. 4.

The cover sheet 20 is arranged to the upper face of the base member 12 in sealing engagement therewith, which attachment may be effected by any suitable means including, for example, the use of an adhesive, not shown, or simply by non-adhesive frictional and interfacial forces between the smooth flat upper face of the base member and the marginal edges of the cover. With the cover sheet 20 attached to the base member 12, an air chamber, or cavity is defined between the recess 18 in the base member and the attached cover sheet 20, which chamber is adapted for connection to a low air pressure, or vacuum, source through a passageway 24 formed in the base member 12.

As noted above, the novel carrier is adapted for use in handling semiconductor chips, wafers, die, or other such smooth-surfaced articles. In FIGS. 1–4, a semiconductor chip 26 is shown resting on the surface of the flexible sheet 20. The cover sheet 20 may, for example, comprise an elastomeric member having a smooth upper face to provide for high interfacial retention forces between the sheet and the smooth-faced device 26 supported thereon. Alternatively, a pressure sensitive adhesive, not shown, may be provided at the upper face of the cover sheet 20 for adhesive retention of the device 26 thereon. In any event, means are provided for securely holding the device 26 on the cover sheet 20 through attachment of their adjacent faces such that the device can not be readily removed using conventional tweezers or vacuum techniques while the sheet 20 is in a flat position illustrated in FIGS. 1–3.

Figure 4:
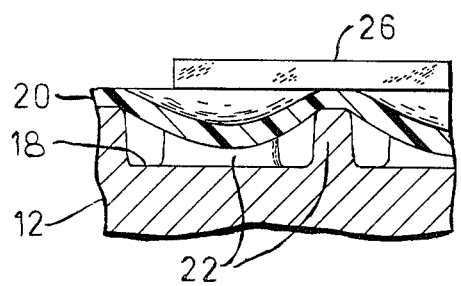
FIG. 4 is an enlarged fragmentary sectional view which is similar to that of FIG. 3 but showing the flexible film drawn down into recess means in the carrier base for reduced surface contact between the chips and film.

To facilitate removal of the device 26 from the cover sheet 20 the surface contact between the cover sheet and device is reduced by drawing portions of the cover sheet 20 adjacent the recess 18 downwardly into the recess. To pull portions of the cover sheet which are adjacent the recess downwardly into said recess, the air chamber defined between the recess and cover is connected to a vacuum, or low pressure, source. During chip removal operation, the base member 12 may be supported on a vacuum chuck, or table, 30 which is provided with vertical walls 32 to define a recess 34 in the upper face thereof. Downwardly extending walls 36 on the base member 12 surround the walls 32 of the chuck when the base member 12 is positioned on the chuck, and a substantially fluid tight chamber is defined between the bottom of the base member 12 and recess 34 in the chuck. A passageway 40 in the vacuum chuck is provided for connection of the recess 34 to a vacuum, or low pressure, source through a control valve 42. Low pressure in the chamber between the chuck 30 and base member 12 is communicated through the passageway 24 in the base member 12 to the recess 18 in the face of the base member whereupon the flexible cover sheet 20 is drawn downwardly into the recess, as shown in FIG. 4. Surface contact between the chip 26 and supporting sheet 20 is reduced by withdrawal of portions of the sheet 20 into the recess 18 thereby reducing the magnitude of the force by which the chip is attached to the film thereby allowing ready removal of the chip by a vacuum needle, tweezer, or the like.

With the present invention, the surface of the chip supporting sheet 20 is converted from a flat condition, for full surface contact with the device 26, to a wavy or undulating condition for a reduction in the surface contact between the sheet 20 and devices supported thereon. The invention is adapted for use with a wide variety of chip sizes; with the number and size of protuberances 22 employed in the base member 12 being selected in relation to the size of the chips 26 to be handled. The relative dimensions are such that the chip is supported through the cover sheet 20 in a level condition by one or more of the protuberances, and remains level when portions of the sheet are drawn downwardly into the recess in the base member 12. A chip which is too small for proper use with the carrier 10 could be drawn down with the cover sheet 20 into a recess, which would not facilitate removal of the chip from the carrier.

With the protuberances array shown in the embodiment of FIGS. 1–4, the resultant recess includes only short straight line segments to avoid creation of a long straight line crease in the cover sheet 20 when portions of the sheet are drawn into the recess 18. This helps to avoid adhesion of the surface along an entire edge of a chip with the depressed portion of the cover sheet and resultant tilting of the chip on the carrier.

As noted above, the flexible cover member 20 may comprise an elastomeric film which returns to a smooth, flat, condition upon release of the vacuum in the recess 18 for reuse of the carrier including the member 20. An elastomeric member may be formed using a suitable curable liquid polymer such as Sylgard 184 (Dow-Corning), a curable two part silicone elastomer material which may be formed with smooth opposite faces. Use of an elastomer having a Shore A hardness of from about 15 to about 90 is practical, with a range of between about 30 to 65 Shore A being preferred. Obviously, other factors including thickness of the film 20, configuration of the recess 18, and vacuum employed also determine the degree of texturing, or waviness, which is obtained. In one arrangement, a Sylgard 184 elastomeric film about 1/64 in. thick and having a Shore A hardness of 35 was used in a system employing a vacuum of approximately 20 psi. With this elastomeric material, retention forces between the bottom face of the film 20 and the smooth upper face of the base member 12 normally are sufficiently great such that no adhesive or other such bonding means are required to provide an adequate seal therebetween to obtain the necessary vacuum. Also, chips 26, or the like, which are placed on the flat film 20 with a slight pressure to assure good contact between the film and chip, are tightly held in position on the film by frictional and interfacial forces so long as the film remains in the flat condition. Even when the tray is turned over, chips remain attached to the film and are not readily removed by a vacuum needle.

If desired, a flexible but substantially non-resilient film 20 may be used in the carrier, such as Mylar or other such film, in which case the cover 20 is replaced following every use, after a vacuum has been applied and chips removed therefrom.

Figure 5:
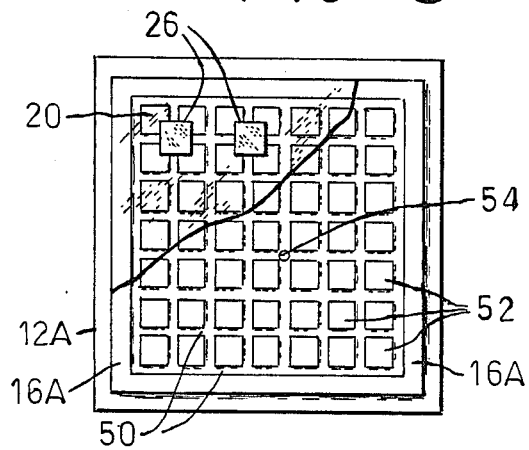
FIG. 5 is a plan view of a modified form of carrier in which the base member includes recess means formed by intersecting grooves.

Obviously, the invention is not limited to use of a carrier in which the recess 18 has the pattern illustrated in FIGS. 1-4. Reference now is made to FIG. 5 wherein a carrier 10A is shown comprising a base member 12A of the same general type as base member 12 shown in FIGS. 1-4 and described above, together with a flexible cover sheet 20 only a portion of which is shown in FIG. 5. The upper face of the base member 12A is formed with a plurallity of intersecting grooves 50 which define a two-dimensional array of protuberances, or pads 52, the upper faces of which lie in the plane of the margins 16A of the face. The flexible cover 20 is attached to the face of the base member 12A, overlying the grooves 50. The chamber defined by the grooves 50 and flexible cover 20 is adapted for connection to a vacuum source, not shown, through a passageway 54 in the base member. A vacuum chuck, such as a vacuum chuck 30 shown in FIG. 2, may be used for connection of the carrier to a vacuum source. When a vacuum is drawn, portions of the film, or cover, 20 are drawn into the grooves thereby reducing the contact between chips 26 supported on the film and the film, and allowing for ready removal of the chips from the film as by use of a vacuun needle, tweezers, or the like. With this arrangement, care generally must be taken to avoid locating an edge of a chip directly over a groove in alignment therewith, thereby avoiding possible tilting of the chip when a vacuum is applied. Obviously, the chip must be of sufficient size to overlie one or more grooves to obtain a reduction in surface contact when the film is withdrawn into the grooves.

Figure 6:
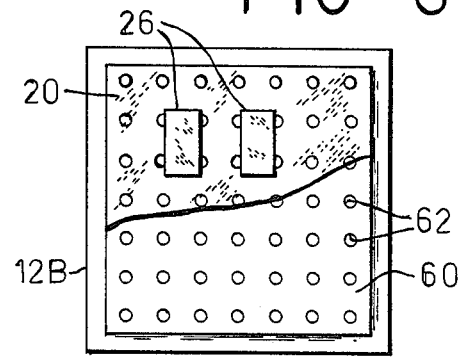
FIG. 6 is a plan view of another modified form of carrier in which the base member includes an array of holes through the face thereof.

In another embodiment of this invention, shown in FIG. 6, a modified form of base member 12B is employed which is of the same general type as base members 12 and 12A, described above. As seen in FIG. 6, base member 12B has a smooth upper face 60 which is covered by a flexible cover sheet 20 attached thereto. A plurality of holes, or passageways, 62 are formed through the base member 12B extending from the face 60 to the bottom thereof. As with the other carriers, the base member 12B is adapted for operation with a vacuum chuck, or the like, such as chuck 30 shown in FIG. 2, for connection of the passageways 62 to a vacuum source. With a reduced pressure in the passageways, portions of the flexible cover 20 are drawn downwardly into the passageways 62 to reduce surface contact between the film 20 and chips 26 supported thereon. With this arrangement, care must be taken to avoid complete overlay of a passageway by a chip to avoid formation of a vacuum between the chip and adjacent portion of the flexible cover 20 drawn downwardly into the passageway.

Figure 7:
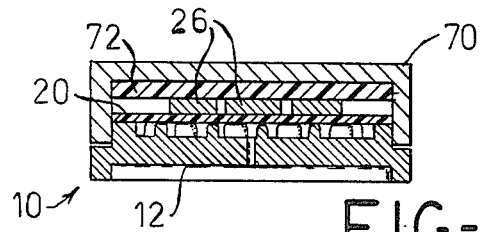
FIG. 7 is a cross sectional view showing a carrier with a cover for use as a shipping container.

The novel carrier of this invention is well adapted for use in a shipping container for shipping semiconductor chips, wafers, etc. In FIG. 7, to which reference now is made, there is shown a carrier 10, which may be of the same type shown in FIGS. 1-4 and described above, which is provided with a cover 70. Chips 26 to be transported are shown supported on the flexible sheet 20 of the carrier, and a resilient foam plastic layer 72 is shown placed over the chips to further hold them in place when the cover 70 is attached to the carrier 10. The force of the foam plastic layer 72 on the chips adds to the retention forces between the chips and sheet 20 to maintain the chips in position on the sheet during handling and/or shipping of the container. At the destination, the cover 70 and foam plastic layer 72 are removed from the carrier, and the base member 12 is attached to a vacuum chuck for drawing of a vacuum in the recess between the flexible film 20 and base member 12. As described above, this causes the film 20 to be drawn into the recess, or cavity, in the face of the base member which, in effect, imposes a texture or waviness on the film thereby reducing the surface contact between the chip and film. Retention forces between the chips and film are thereby reduced whereupon the chips are readily removable by a vacuum needle, tweezers, or the like. Since chips remain in position on the carrier without relative movement during handling and shipping, the carrier of this invention is well adapted for use with automated chip-handling equipment since orientation of the chips on the carrier is a known factor.

Figure 3:
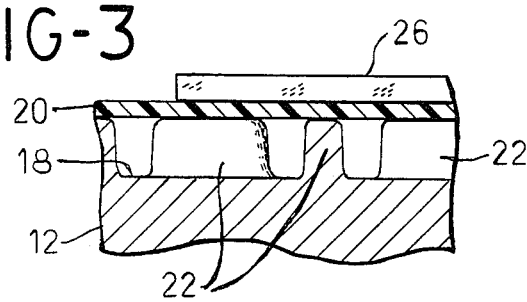
FIG. 3 is an enlarged fragmentary sectional view of the carrier showing a chip in full face contact with the cover film.
Figure 8:
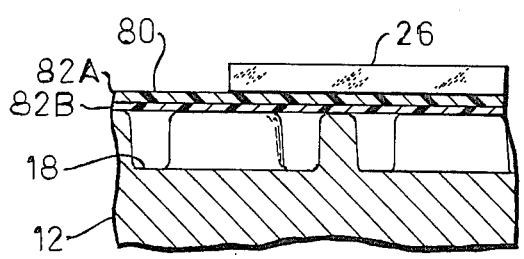
FIG. 8 is an enlarged fragmentary sectional view which is similar to that of FIG. 3 but showing a modified flexible film cover.

The invention having been described in detail in accordance with requirements of Patent Statutes, various other changes and modifications will suggest themselves to those skilled in the art. For example, a laminated cover sheet may be employed to provide for desired film properties. Reference is made to FIG. 8 wherein an enlarged fragmentary sectional view which is similar to that of FIG. 3 is shown, comprising a base member 12 with a modified form of cover sheet 80 attached to the face thereof for support of chips, such as chip 26. The cover sheet 80 comprises a laminated member which includes upper and lower layers 80A and 80B, respectively. The upper layer 80A comprises an elastomer having a smooth upper face to which chips, or the like, tightly adhere when pressed into intimate surface contact therewith. A silicone elastomer is preferred since it retains desired properties over a wide range of conditions, including use at high temperatures. The lower layer 80B comprises a plastic flexible film affixed to the upper layer 80A and having a smooth bottom face for intimate engagement with the upper face of the associated base member 12. A suitable plastic for this use includes polyethylene terephthalate (Mylar) which has high strength over a wide range of temperatures. As in other embodiments, the laminated sheet 80 is supported in a flat condition on the associated base member to provide for high surface contact between the sheet and chips supported thereon. The sheet is sufficiently flexible to allow for withdrawal of portions thereof into the recess 18 in the face of the base member when the recess is connected to a vacuum source, for reduction of the surface contact between the sheet and chips supported thereon when chip removal is required. It is intended that the above and other such changes and modifications shall fall within the spirit and scope of the invention defined in the appended claims.

We claim:

1. A method of handling objects such as semiconductor chips, wafers, or like devices, said method including,
attaching a flat sheet member to the flat face of a base member in which recess means are formed,
attaching objects to said flat sheet member by interfacial forces between said sheet member and said objects, and
deforming the flat sheet member by drawing portions thereof into said recess means for withdrawing portions thereof away from said objects while maintaining the objects substantially in a plane without forming a vacuum between the sheet member and said objects for reducing the overall force by which the objects and flat sheet are held to one another by a reduction in the contact area and interfacial forces between the sheet and said objects to allow for ready removal of said objects from said sheet,
the step of deforming the flat sheet member by drawing said portions of the sheet member into said recess means including connection of said recess means to a vacuum source.

2. A method of handling objects such as semiconductor chips, wafers, or like devices as defined in claim 1 wherein said flat sheet member comprises an elastomer which returns to a flat condition upon restoration of ambient pressure to said recess means.

3. A method as defined in claim 1 wherein said objects are attached to said flat sheet member by nonadhesive, interfacial, forces between said object and flat sheet member.

4. A method as defined in claim 1 wherein said objects are attached to said flat sheet by pressure sensitive adhesive interfacial forces between said objects and flat sheet member.

* * * * *